United States Patent [19]

Thalheimer

[11] Patent Number: 4,758,526

[45] Date of Patent: Jul. 19, 1988

[54] PROCEDURE FOR PRODUCING AN INTEGRATED SYSTEM OF THIN-FILM SOLAR CELLS CONNECTED IN SERIES

[75] Inventor: Klaus Thalheimer, Munich, Fed. Rep. of Germany

[73] Assignee: Messerschmitt-Bölkow-Blohm GmbH, Munich, Fed. Rep. of Germany

[21] Appl. No.: 15,266

[22] Filed: Feb. 17, 1987

[30] Foreign Application Priority Data

Feb. 17, 1986 [DE] Fed. Rep. of Germany ....... 3604917

[51] Int. Cl.[4] ............................................. H01L 31/18
[52] U.S. Cl. ........................................ 437/2; 136/244; 136/258; 437/4; 437/51; 437/205
[58] Field of Search ...................... 437/2, 4, 51, 205; 136/244, 258 AM

[56] References Cited

U.S. PATENT DOCUMENTS 3,151,379 10/1964 Escoffery ................................ 437/4
4,243,432 1/1981 Jordan et al. ....................... 136/244

FOREIGN PATENT DOCUMENTS 60-211906 10/1985 Japan .................................. 136/244

Primary Examiner—Aaron Weisstuch
Attorney, Agent, or Firm—Kenyon & Kenyon

[57] ABSTRACT

A process for producing an integrated system of thin-film solar cells (14, 15) connected in series, wherein a first electrode layer is initially large-area deposited on a substrate and subsequently a photosensitive layer composed of sublayers is applied. Before structuring of the layers, for the purpose of series connecting, a second electrode layer is large-area applied on the photosensitive layer. Predetermined areas are then removed from the three layers to permit connection (12) of the now insulated individual solar cells (14, 15). This technique, overall, is particularly economical.

3 Claims, 1 Drawing Sheet

PROCEDURE FOR PRODUCING AN INTEGRATED SYSTEM OF THIN-FILM SOLAR CELLS CONNECTED IN SERIES

BACKGROUND OF THE INVENTION

The invention relates to a procedure for producing an integrated system of thin-film solar cells connected in series, which have on a substrate a series of layers consisting of a first electrode layer, a photosensisive layer composed of sublayers, and a second electrode layer.

A procedure of this nature is known from, for example, the DE-OS No. 28 39 038. The arrangement described there is intended for the production of series connected systems of barrier layer photoelectric cells, in which a first electrode layer consisting of tin oxide is initially applied on a glass substrate and subsequently a photosensitive layer consisting of cadmium sulphide and of copper(I) sulphide (cuprous sulphide). For the purpose of separating individual solar cells as well as in preparation of the series connection of the cells, predetermined areas of the photosensitive layer and the first electrode layer subjacent to it are removed. In the first case, this is done by punching or miter cutting, and, in the second case, by electro-erosion, laser irradiation, masking or etching. The removed areas of the photosensitive layer are significantly broader than the section of the subjacent electrode layer which needs to be removed. The latter do not lie in the center of the layer gaps of the photosensitive layer but are displaced toward a margin. In a subsequent processing step insulating materials are applied on both sides of the gap in the photosensitive layer. One of these two insulating masses reaches into the relatively narrow layer gaps of the electrode layer. Between both insulating masses, an adhesive agent is applied to the exposed surface of the electrode layer and subsequently a second electrode layer, consisting of copper, is vapor-deposited over the entire surface of this structure. By applying ultransonic energy in the area of one of the insulating masses, which do not reach into the gaps of the first electrode layer, this insulating mass with the copper layer above it is eroded so that a structure is obtained in which, through the remaining copper layer, the first electrode layer of a solar cell is electrically connected with the upper side of the photosensitive layer of the adjacent solar cell.

Over all, this known production method is relatively expensive. The required extensive large-area separating processes have to be interrupted following the application of the second layer, namely the photosensitive layer, in order to structure the already applied layers as well as to insert into the layer gaps created in this way an adhesive agent and two insulating masses in each instance. The latter insulating masses, moreover, need to be selected from different materials, since only one of the materials is intended to respond to the later employed ultrasonic energy. Only then is the third layer, namely the second electrode layer, applied over a large area, which now, however, covers one of the insulating substances, which has actually become superfluous and therefore has to be sonically eroded together with the area of the second electrode layer lying above it. Only in this way is the second electrode layer structured. Such production methods seem, in view of the overall demand in terms of process expenditures, in need of improvement.

SUMMARY OF THE INVENTION

For this reason, the invention is based on the need for making available a process of the above mentioned kind, which requires overall in terms of processing technology the fewest expenditures possible and is therefore, in economic terms the most cost-effective.

The need is solved in accordance with the invention in that the second electrode layer after separation of the photosensitive layer is likewise large-area deposited on the latter and only then the required structuring of the three layers is carried out.

Advantageous further developments of the invention can be inferred from the subsequent disclosure.

The particular advantage of the process according to the invention lies in the fact, that all three layers, namely the two electrode layers as well as the intermediate photosensitive layer can be applied directly over large areas in succession. Since this deposition of layers frequently takes place in a vacuum, the vacuum process does not need to be interrupted. Structuring of all three layers can subsequently also take place directly. The expensive and actually unnecessary deposition of insulating materials which later have to be removed again can be omitted, since the second electrode layer is now structured first, while in the known process, this takes place only at the end through the removal of the particular insulating agent. It follows, that for each individual solar cell only one insulating mass needs to be applied at its margin which, like the corresponding one in the known process, reaches into the gaps of the first electrode layer created in the structuring process.

BRIEF DESCRIPTION OF THE DRAWINGS

Below, an embodiment of the invention on the basis of the illustrations is explained in detail.

DETAILED DESCRIPTION

Figure 1:
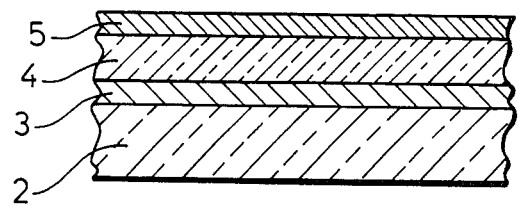
FIGS. 1 to 5 illustrate the production process on the basis of five layer structures, which in the course of the production process are obtained as intermediate steps and end product.
Figure 2:
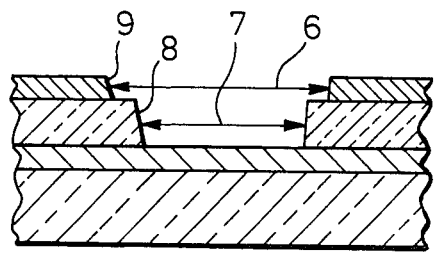

The embodiment refers to the production of an integrated thin-film solar cell system connected in series, in which the photosensitive layer 4 consists of amorphous silicon, the first electrode layer 3 of a transparent, conducting oxide, for example, indium-tin-oxide (ITO), and the second electrode layer 5 of a thin metal layer, for example, aluminum, nickel, silver, gold or titanium, present as single elements or as mixtures, for instance, aluminum and silicon. The first electrode layer 3 is applied to a glass substrate 2. FIG. 1 shows as a partial cross section an intermediate step in the production process after the large-area vacuum deposition of the three layers 3, 4, and 5 has taken place immediately one after another. The photosensitive layer, here of amorphous silicon, is, of course, for the purpose of generating under light irradiation as well as separating the charged particles so generated composed in the customary manner of sublayers, for example, according to a p-i-n structure or a p-n structure. These sublayers can be deposited successively by known glow discharge processes from a silicon hydride atmosphere. For depositing the first electrode layer 3, consisting of a transparent conducting oxide, as well as the second electrode layer 5, consisting of a thin metal layer, known vacuum deposition processes can be employed, for example, vacuum metallization or sputtering.

For the purpose of structuring the second electrode layer 5 as well as the subjacent photosensitive layer 4, predetermined areas 6 respectively 7 are removed in the next step of the process. This can be done appropriately by etching, for example, using screen-printing. In this process it is advantageous, to make sure that the area 6 of the second electrode layer 5 which is removed is somewhat wider than that (7) of the subjacent photosensitive, amorphous silicon layer 4, so that the margins 8 of the remaining area of the photosensitive layer 4 project a little beyond the margins 9 of the remaining areas of the second electrode layer 5. In this way, one can avoid that material reaches from the margins of the second electrode layer 5 in uncontrollable ways to margin areas of the photosensitive layer 4 down to the first electrode layer 3 which would practically short circuit the solar cell. As further practically applicable processes for successive structuring of the two top layers, application of the etching agent with tampon printing or spraying with needle metering systems is possible. It is equally possible to achieve through appropriate selection of the etching medium that the areas 6, 7 are removed with only one single etching agent. One only needs to make sure that the second electrode layer 5 is etched somewhat more than the photosensitive layer 4, so that margins 8 result, which project a little beyond the margins 9 of the remaining areas of the second electrode layer 5. A further practically applicable process for structuring the photosensitive layer 4 is ultrasonic removal with a probe.

Figure 3:
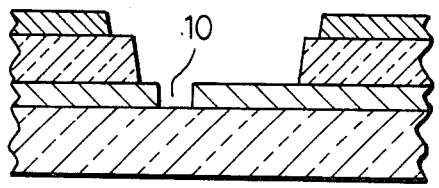
Figure 4:
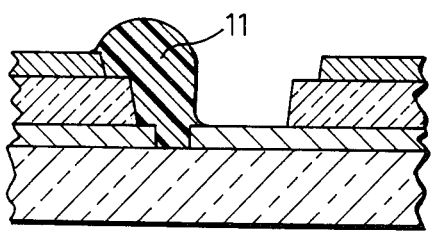

According to FIG. 3, the relatively narrow predetermined layer areas 10 are removed from the first electrode layer 3 in a subsequent step, preferentially by irradiation with a laser beam or by electro-erosion. It is possible to precisely remove a particularly narrow layer area in this way. Above the resulting layer gap, a preferentially initially viscous insulating substance is applied according to FIG. 4, which covers the margin areas 9 and 8 of the second electrode layer 5 and the photosensitive layer 4 as well as reaches down into the layer gap of the first electrode layer 3. The insulating substance 11 can be applied using screen-printing or a similar process.

Figure 5:
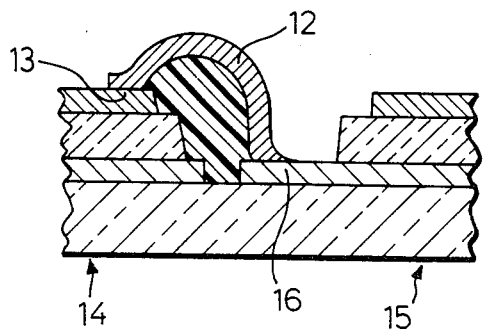

Finally, in the last step of the procedure, according to FIG. 5 an electrically conducting paste 12, for example, silver conductive paste, which hardens after application, is applied on top of the insulating material 11, which then connects the margin area 13 of a solar cell 14 with the exposed first electrode layer 16 of the adjacent solar cell 15. The application of the electrically conductive paste 12 can be carried out by, for example, screen-printing; tampon printing as well as needle metering systems can also be employed.

Overall, the procesing method according to the invention represents a simply structured and economical production process. Especially, the possibility of successively applying three large-area layers in an uninterrupted vacuum process represents progress. But also the sequence of the additional steps in the process resulting from this method lead obviously in a simple way, direct and without unnecessary detours, to the desired result. The procedural method is not limited to the production of solar cell systems, in which the photosenstive layers consist of amorphous silicon. Rather, it can be employed with other thin-film structures of a kind known per se, for example, TFTs (thin film transistors) or large-area photosensors. The achieved advantage is particularly pronounced when the three large-area layers according to the state of the art are each deposited in vacuum processes, which can now be combined in a single uninterrupted vacuum process.

I claim:

1. A method for producing an integrated system of a plurality of thin-film solar cells connected in series, the solar cells being disposed on a common substrate and each having a layer sequence comprising a first electrode layer, a photosensitive layer comprising a plurality of sublayers and a second electrode layer, the first electrode layer being large area deposited on the substrate and the photosensitive layer being large area deposited on the first electrode layer, the second electrode layer being large area deposited on the photosensitive layer, said three layers being structured by successive removal of predetermined layer areas for the purpose of separating and connecting the individual solar cells, said step of structuring being performed after the steps of depositing said three layers, said step of structuring comprising the steps of removing a first predetermined area of the second electrode layer and second smaller predetermined area of the photosensitive layer below the first predetermined area, said second predetermined area establishing exposed margins adjacent the edges of the first predetermined area, removing a third predetermined area of the first electrode layer substantially smaller than said first and second predetermined areas below said first and second predetermined areas, applying insulating material so as to cover an exposed marginal area of the second electrode layer and an exposed marginal area of the photosensitive layer, said insulating material extending into and covering a gap created in the first electrode layer established by the removal of said third predetermined area, applying a conductive paste on top of the insulating material and in electrical contact with the top marginal surface area of the second electrode layer adjacent the insulating material and with a top marginal surface area adjacent the gap of the first electrode layer associated with an adjacent solar cell thereby to place said individual solar cells in series electrical connection.

2. The method recited in claim 1, wherein the steps of removing the predetermined areas of the second electrode layer and the photosensitive layer comprise the step of etching.

3. The method recited in claim 1, wherein the step of applying the insulating material and the step of applying the conductive paste comprises the step of screen-printing.

* * * * *